INVENTOR.
Henry S. Sommers, Jr.
BY Morris Rabkin
ATTORNEY.

INVENTOR.
Henry S. Sommers, Jr.
BY Morris A. Rabkin
ATTORNEY.

Oct. 19, 1965 H. S. SOMMERS, JR 3,212,999

PURIFICATION APPARATUS UTILIZING A THERMOELECTRIC HEAT PUMP

Filed July 30, 1957 5 Sheets-Sheet 3

INVENTOR.
Henry S. Sommers, Jr.
BY
Morris L. Rabkin
ATTORNEY.

INVENTOR.
Henry S. Sommers, Jr.
BY Morris A. Rabkin
ATTORNEY.

INVENTOR.
Henry S. Sommers, Jr.
BY Morris A. Rabkin
ATTORNEY.

United States Patent Office 3,212,999
Patented Oct. 19, 1965

3,212,999
PURIFICATION APPARATUS UTILIZING A THERMOELECTRIC HEAT PUMP

Henry S. Sommers, Jr., Princeton, N.J., assignor to Radio Corporation of America, a corporation of Delaware

Filed July 30, 1957, Ser. No. 675,211
16 Claims. (Cl. 202—163)

The present invention relates to thermoelectric apparatus, and more particularly to system for effecting a change of state of material using thermoelectric heat pumps.

Thermoelectric heat pumps of the type suitable for use in systems provided by the present invention operate in accordance with the Peltier effect. Basically, such heat pumps include a body of material having a high thermoelectric power, such as a semiconductor, bonded between a pair of metal electrodes. When current passes through the heat pump, one of the electrodes provides a cold junction which absorbs heat from the ambient, while the other electrode provides a hot junction which releases heat to the ambient. In this way, heat is pumped through the thermoelectric heat pump from one junction to the other and a temperature gradient is established thereacross. An amount of energy is expended in pumping heat to a higher temperature across the temperature gradient. In accordance with the invention, a thermoelectric heat pump is utilized with optimum efficiency upon minimization of the temperature gradient. The invention is described herein as applied in a novel system for effecting a change of state or physical phase in a material which is liquid at normal, ambient temperatures, and in particular to systems for the distillation of water by a cyclic change of state process.

The availability of a huge supply of pure water is essential to modern human experience. The largest and most accessible supply of water resides in the sea. However, the saline content of sea water is too high to make it suitable for human consumption. It has been proposed heretofore to distill sea water, thereby providing an almost inexhaustible supply of fresh water. Such proposals have not been extensively accepted, due to their being economically unfeasible. Prior apparatus for distilling sea water has been difficult to construct, extremely complex, or excessively bulky. Due to the novel incorporation of thermoelectric heat pumps, a system provided by the present invention may be smaller, simpler, and less expensive to operate than those heretofore proposed.

Briefly described, the invention involves the use, in a system for effecting a change of state or physical phase, of a unit wherein changes of state cyclically take place. The unit may comprise a structure which is internally compartmentalized by thermoelectric heat pumps. A different compartment is provided on opposite sides of each of the heat pumps. In one of the compartments, a change of phase of one type is effected while a change of phase of the type opposite thereto takes place simultaneously in the other compartment. For example, water may be evaporated or frozen in the one compartment and, respectively, condensed or melted in the other compartment. The thermoelectric heat pumps are structurally adapted to obtain maximum heat pumping efficiency by virtue of the disposition of the compartments in which the changes of state are effected in minimizing the temperature drop across each of the heat pumps.

It is therefore an object of the present invention to provide more efficiently operating thermoelectric apparatus.

It is a further object of the present invention to provide improved systems for cyclically effecting changes of phase which are suitable for use in purifying liquid mediums.

It is a still further object of the present invention to provide improved systems for effecting changes in state which incorporate, in a novel manner, improved thermoelectric apparatus.

It is a still further object of the present invention to provide systems for effecting changes of state which may be simpler, less complex, smaller in size, and which have lower operating costs than such systems which have been heretofore available.

Other objects and advantages of the present invention will, of course, become apparent and immediately suggest themselves to those skilled in the art to which the invention is directed from a reading of the following description in connection with the accompanying drawings in which.

Figure 1:
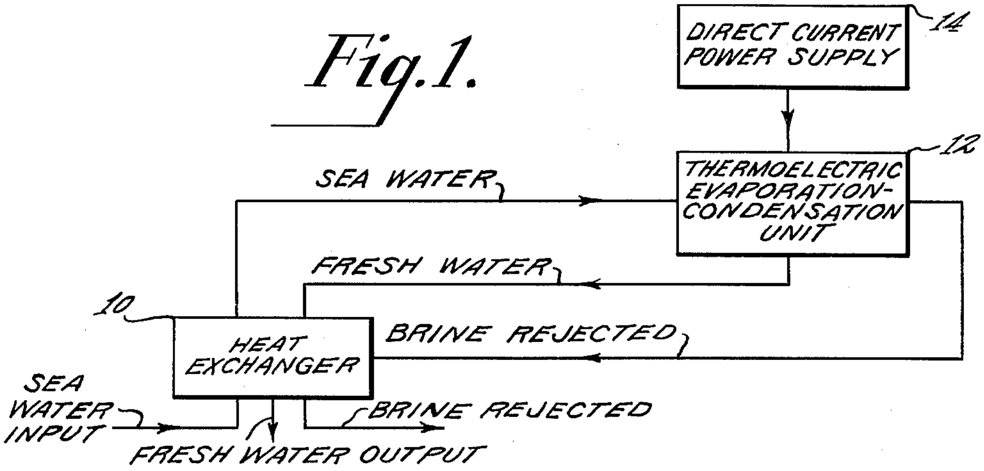
FIG. 1 is a flow chart showing the operation of a system embodying the present invention.

Referring again to the drawings, and particularly to FIG. 1 thereof, there is shown a flow chart illustrating the operation of a system for effecting a change of state for the purification of sea water. Sea water is passed through a heat exchanger 10 wherein it is preheated. The heat exchanger may be of a conventional type wherein a plurality of fluids pass in counterflowing relationship. The sea water is then pumped to a thermoelectric evaporation-condensation unit 12. This unit will be described in detail, hereinafter. It includes a novel structure incorporating thermoelectric heat pumps for efficiently effecting a cyclical change of state of the sea water from liquid to vapor form and then from vapor into liquid form. The liquid which is condensed from the vapor is fresh water. A direct current power supply 14 provides operating power for the thermoelectric heat pumps of the thermoelectric evaporation-condensation unit 12. The output of the thermoelectric evaporation-condensation unit is fresh water and somewhat concentrated sea water in the form of brine. Both the fresh water and the brine are returned through the heat exchanger to preheat the sea water. The brine is ultimately rejected, for example, by being returned to the sea. The fresh water is available for consumption.

Figure 2:
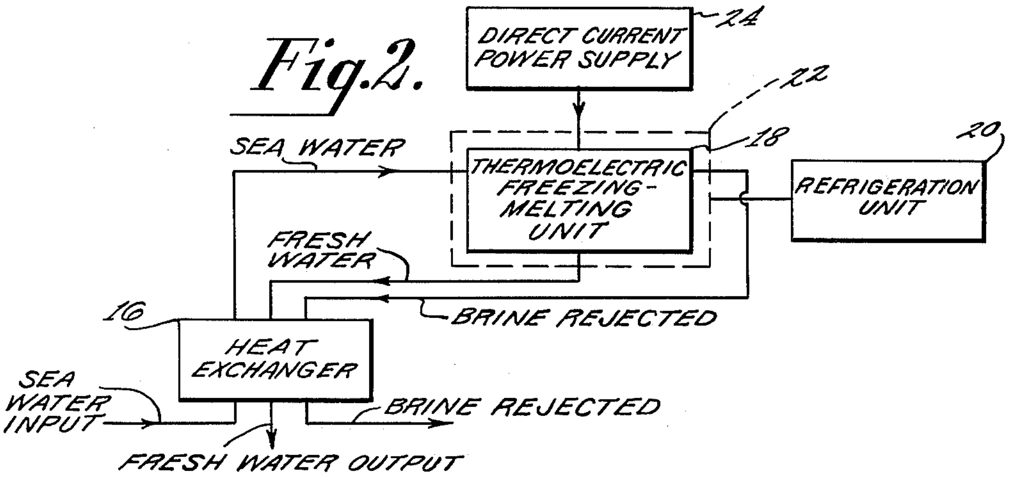
FIG. 2 is a flow chart showing the operation of a system incorporating another embodiment of the present invention.

The system shown in the flow chart of FIG. 2 provides the same output as does the system shown in the flow chart of FIG. 1, namely, fresh water. Purification of sea water is effected in the system shown in FIG. 2 by means of freezing and then melting the sea water in accordance with a cyclic process. The sea water is initially passed through a heat exchanger 16, wherein it is precooled. After leaving the heat exchanger, the sea water is introduced into a thermoelectric freezing-melting unit 18. The unit 18 is described in detail thereinafter. Briefly, it incorporates a novel structure including thermoelectric heat pumps for cyclically freezing the sea water into ice and thereafter melting the ice to provide fresh water. Since the freezing and melting operation takes place at a temperature of approximately 32 degrees Fahrenheit, which is normally below the ambient temperature, a refrigeration unit 20, which may be of any conventional type, is used to cool a chamber 22 in which the thermoelectric freezing-melting unit is located. The chamber 22 may be an insulated box and is illustrated in the drawing by the dash lines. A direct current power supply 24 similar to the power supply 14 is used to provide operating power for the thermoelectric heat pumps in the thermoelectric freezing and melting unit 18. Both fresh water and brine are produced in the thermoelectric freezing-melting unit. The fresh water and the brine pass through the heat exchanger 16 so as to precool the input sea water. The brine is rejected, as by being pumped back into the sea, and the fresh water is available for consumption.

Figure 3:
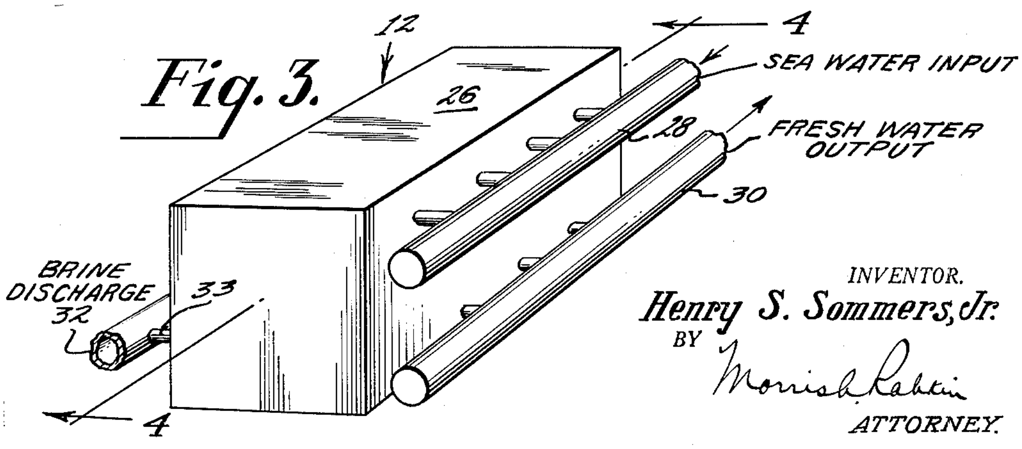
FIG. 3 is a perspective view of the thermoelectric evaporation-condensation unit shown in FIG. 1.
Figure 4:
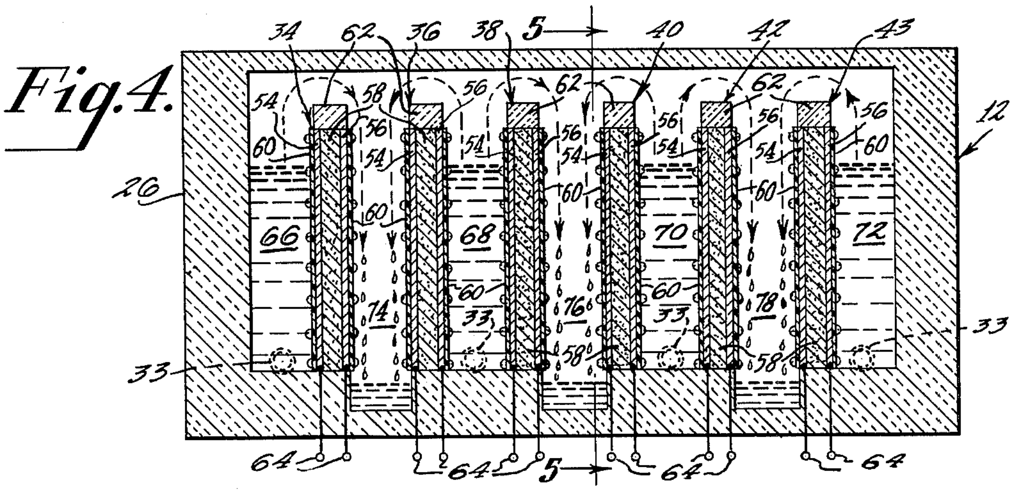
FIG. 4 is a longitudinal sectional view taken along the line 4—4 of FIG. 3.
Figures 5, 6:
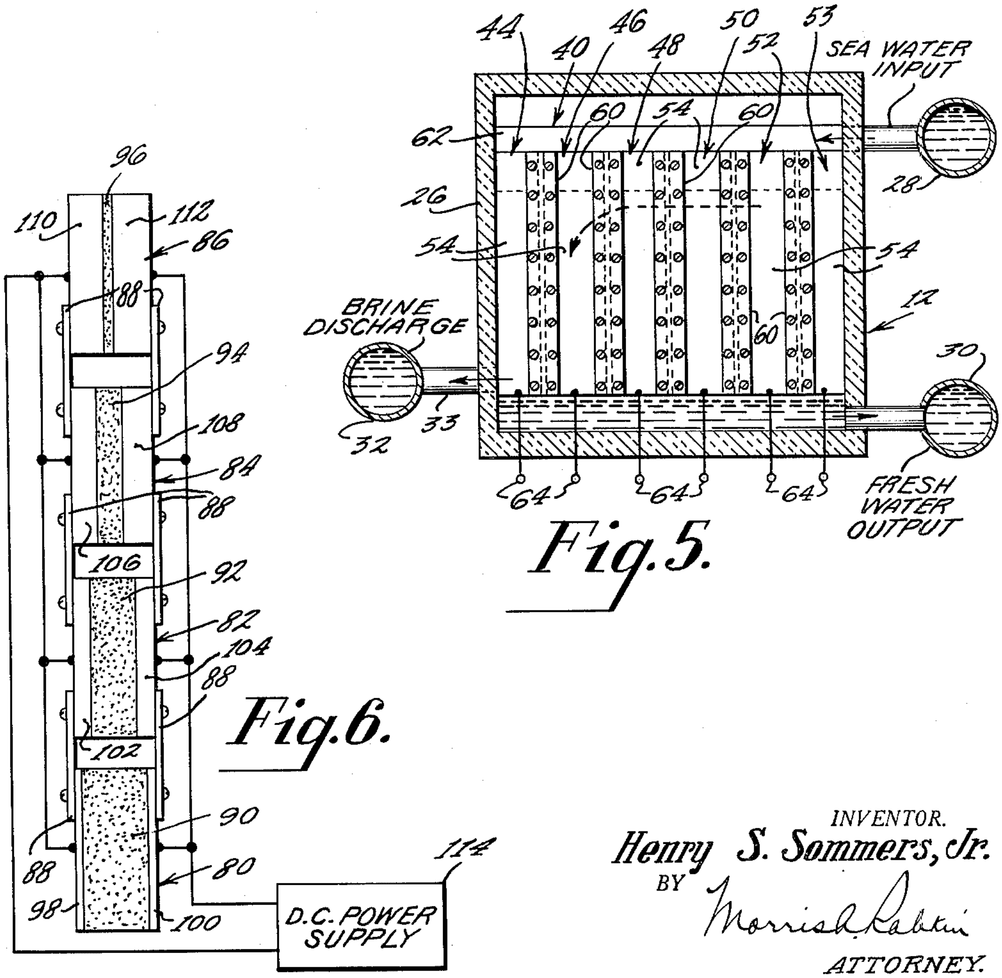
FIG. 5 is a transverse sectional view taken along the line 5—5 of FIG. 4.
FIG. 6 is a schematic diagram showing the electrical connection to a power supply of a thermoelectric heat pump of the type shown in FIGS. 4 and 5.

The thermoelectric evaporation-condensation unit 12 is shown in detail in FIGS. 3, 4 and 5. FIG. 3 illustrates an insulated container 26 which is compartmentalized into a plurality of compartments 66, 74, 68, 76, 70, 78 and 72. Three manifolds 28, 30 and 32 provide conduits for the sea water, fresh water and brine, respectively. The manifolds are connected through conduits to different ones of the compartments. The manifold 28 provides for the introduction of sea water into the compartment. This manifold 28 is disposed above the fresh water output manifold 30 and the brine discharge manifold 32. The container 26 may be rectangular in shape. Each of the walls of the container 26 may be constructed from some refractory, insulating material such as a ceramic. A plurality of thermoelectric heat pump panel units 34, 36, 38, 40, 42 and 43 divide the container 26 into the plurality of compartments 66, 74, 68, 76, 70, 78 and 72. It will be appreciated that the particular number of heat pump panel units shown has been selected solely for purposes of illustration. A greater or a smaller number of heat pump panel units may be used if desirable.

Each of the thermoelectric heat pump panel units is constituted of an array of rectangular thermocouple elements 44, 46, 48, 50, 52 and 53. Each of the elements is provided by a sandwich arrangement of a pair of metal plates 54 and 56, or thermojunction members, between which is disposed a body of thermoelectrically active material 58, or thermoelement, so that thermoelectric junctions are formed at the plates 54 and 56. The thermoelectrically active material 58 may be bismuth telluride. However, any material having a high thermoelectric power will be suitable. The thermocouple elements 44, 46, 48, 50, 52 and 53 are connected together to form a panel by means of thin, insulating connector plates 60. The plates may be of some structurally strong plastic material, such as a laminated, thermosetting plastic. The plates 60 may be fastened to each of the plates 54 and 56 by means of rivets. Bars 62 of insulating material, such as the ceramic material from which the container 26 is formed, are separately placed on top of each of the heat pump elements 34, 36, 38, 40, 42 and 43. The heat pump panels rest upon the bottom of the container 26 and may be supported at the ends thereof on the side walls of the container 26. The heat pumps may be energized by means of electrical currents supplied to each of the thermocouple elements 44 to 53 thereof. Terminals 64 which are connected to each of the plates 54 and 56 provide means for an application of electrical power to the thermoelectric heat pump units. Alternate ones of the compartments 66, 74, 68, 76, 70, 78, 72, formed in the container 26 by the heat pump panel units, provide evaporation and condensation compartments, respectively.

The conduits from the sea water input manifold 28 enter at the top of the evaporator or evaporation compartments 66, 68, 70 and 72. Consequently, the evaporation compartments fill with sea water. The thermoelectric heat pumps are operated so that the plates 54 and 56 which face the evaporation compartments, are hot junctions of each of the thermocouple elements 44, 46, 48, 50, 52 and 53. The sea water, before entering the evaporation compartments, is preheated in the heat exchanger 10. Additional heat provided by the thermoelectric heat pump at the hot junctions thereof is sufficient to provide evaporation. As the sea water evaporates, it becomes more concentrated. The conduits 33 to the brine discharge manifold 32 enter the evaporation compartments near the bottom thereof and at the side of the container 26 opposite from the sea water input manifold 28. The concentrated brine is therefore discharged at the bottom of the evaporation compartments 66, 68, 70 and 72.

The vapor which is evaporated in the evaporation compartments follows the path indicated by the dashed lines in FIG. 4 into the condensers or condensation compartments 74, 76 and 78. The thermoelectric heat pumps 34, 36, 38, 40, 42 and 43 are operated so that the cold junction forming plates 54 and 56 are disposed adjacent the condensation compartments 74, 76 and 78. Consequently, the vapor condenses in the condensation compartments 74, 76, and 78 into droplets of fresh water which drop into the bottom of the compartment where a pool of fresh water is formed. The fresh water enters the fresh water output manifold 30 by way of conduits to that manifold, the conduits entering at the bottom of the cendensation compartments 74, 76 and 78.

In operation, the heat energy extracted from the steam on condensation is transferred by the heat pumps 34, 36 and 38, 40, 42, 43 from the condensation compartments to the evaporation compartments to evaporate the sea water. The energy necessary to pump this heat from the condensation compartments to the evaporation compartments is supplied to the heat pumps as electric energy. The quantity of electrical energy which is supplied is minimized, since the temperature difference between the evaporation compartments 66, 68, 70 and 72 and their adjacent condensation compartments 74, 76 and 78 is very small. The difference between the temperature in the evaporation compartments and the condensation compartments may be approximately 1 degree centigrade. For example, the evaporation compartments may operate at 100.5 degrees centigrade while the condensation compartments operate at 99.5 degrees centigrade. By pumping the heat from the condensation compartment to the evaporation compartment, regeneration is effected in the heat pump, and the amount of energy dissipated may be much less than the quantity of heat pumped.

Initially, the evaporation-condensation unit is heated to approximately 100 degrees centigrade, that is, the boiling point of water at standard atmospheric pressure. This may be done by means of the heating action of the heat pumps 34, 36, 38, 40, 42 and 43. Alternatively, an external source of heat may be used. The thermoelectric heat pumps are then operated to pump heat from the condensation compartments 74, 76, and 78 to the evaporation compartments 66, 68, 70 and 72 and provide for the cyclic process involving the phase changes from liquid to vapor to liquid, as described above.

Once a volume of sea water has been brought up to near its boiling temperature, the heat contained in the water is conserved and passed on to successive volumes through the counterflow heat exchanger 10 (FIG. 1). In accordance with the present invention, the transfer of heat between the vapor and liquid phases of the sea water is accomplished by a thermoelectric heat pump which merely transfers heat from the liquid phase, where heat is extracted, to the vapor phase, where heat is added. Consequently, the invention eliminates the need for two independent steps of (1) furnishing heat from an outside source and (2) dissipating that heat into a heat sink. In practicing the invention, it is desirable to conserve the heat developed in the process by the exchange of heat between the output fresh water and the input sea water.

The electrical connections for a heat pump panel unit of the type illustrated in connection with the thermoelectric evaporation-condensation unit are shown in FIG. 6. This heat pump is illustrated herein as having four thermocouple elements 80, 82, 84 and 86. Each of the elements 80, 82, 84 and 86 is provided by a body of suitable thermoelectrically active material sandwiched between a pair of plates of conductive material, such as copper. The connector plates 88, which are similar to the connector plates 60 illustrated in FIGS. 4 and 5, are attached to the metal junction plates of each of the thermocouple elements 82, 84 and 86 and arrange the elements in a panel. The body of thermoelectric material 90 in the thermocouple element 80 is thicker than the body of thermoelectric material 92 in the next adjacent thermocouple element 82. The bodies of thermoelectric material 94 and 96 in the successive thermocouple elements 84 and 86, respectively, are progressively smaller in thickness. The junction plates 98 and 100 of the thermocouple elements 80 are thinner than the junction plates 102 and 104 of the next adjacent thermocouple elements 82. The junction plates 106, 108, 110 and 112 of the remaining thermocouple elements 84 and 86 are progressively thicker than the junction plates 98, 100, 102 and 104. Thicker junction plates are used in order to maintain the overall thickness of the thermocouple elements 80, 82, 84 and 86 constant. The thermocouple elements 80, 82, 84 and 86 are connected, in parallel, with the output of a direct-current power supply 114.

As the sea water flows from the sea water input towards the brine discharge, in the direction indicated by the dashed line headed by the arrow in FIG. 5, the salt concentration increases. When steady state operation is reached, small temperature gradients will exist inside each cell, due to the gradient in salt concentration resulting from the evaporation process itself and due to the gradient in pressure from the pressure head of the water. The effectively tapered construction of thermoelectric panel shown in FIG. 6 can be used to nullify any deleterious effects of the temperature gradients. Thus, the element 80 having the thickest body 90 of thermoelectrically active material will be placed in the region of the compartments having the lowest boiling temperature, which will be at the top (free surface) of the evaporation liquid. For increased boiling temperature, the body of material will be thinner. Thus, the element having the body 96 therein will be disposed at the bottom of the container 26. Under these conditions, all elements 80, 82, 84 and 86 can be operated with the same voltage drop which can be adjusted to give maximum efficiency to all elements simultaneously, since this voltage drop is determined by the nature of the materials in the sandwich providing each thermoelectric element and is independent of the temperature difference across the thermoelectric junctions. Effectively tapering the wall permits an adjustment of the current density so that all parts of the cell surface, while operating at maximum efficiency, can still have an equal rate of evaporation or condensation per unit area of wall. This same result can be achieved by replacing the array of separate cells illustrated in FIG. 6 with a continuous structure in which the layers of the sandwich are suitably tapered. It may be observed, in FIG. 6, that the direct current power supply is connected initially to the junction plate 100 of the thermocouple element 80 on one side thereof and to the junction plate 110 of the thermocouple element 86 at the other side thereof. This connection is desirable in order to equalize the potential at each of the thermocouple elements 80, 82, 84 and 86 by compensating for ohmic losses in the connections.

It may be desirable to provide a valve in the walls of the container 26 between the region wherein the evaporation occurs and the ambient. Initially, this valve may be used as a means to purge the chamber 26 of air which would impede the circulation of the vapor. It may be desirable to operate the process at reduced temperatures. Then, the pressure inside the container 26 may be reduced by exhausting the container through the valve.

Figure 7:
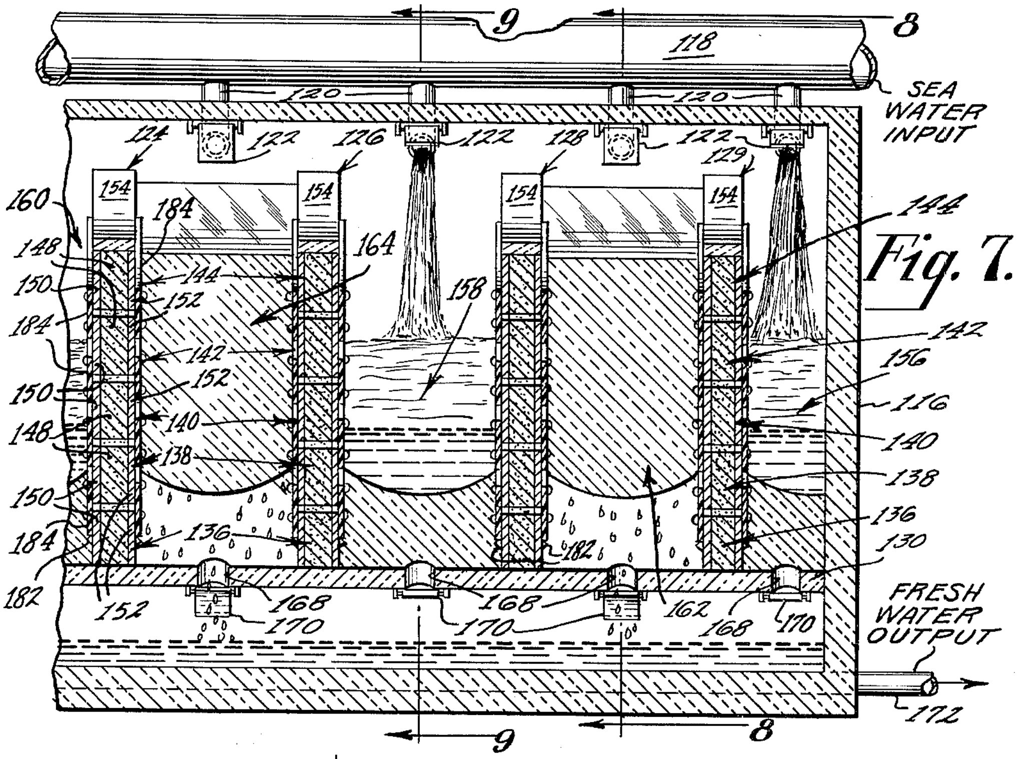
FIG. 7 is a fragmentary, sectional view of the thermoelectric freezing-melting unit shown in FIG. 2, the section being taken along the line 7—7 of FIG. 8.
Figure 8:
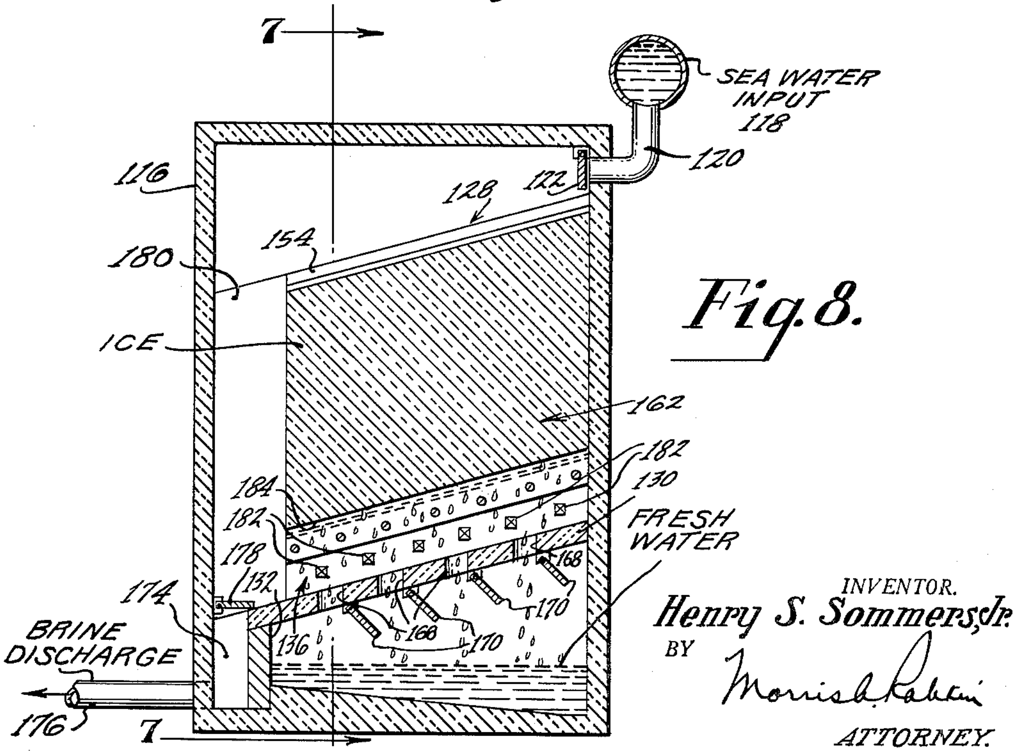
FIG. 8 is a sectional view taken along the line 8—8 of FIG. 7.
Figure 9:
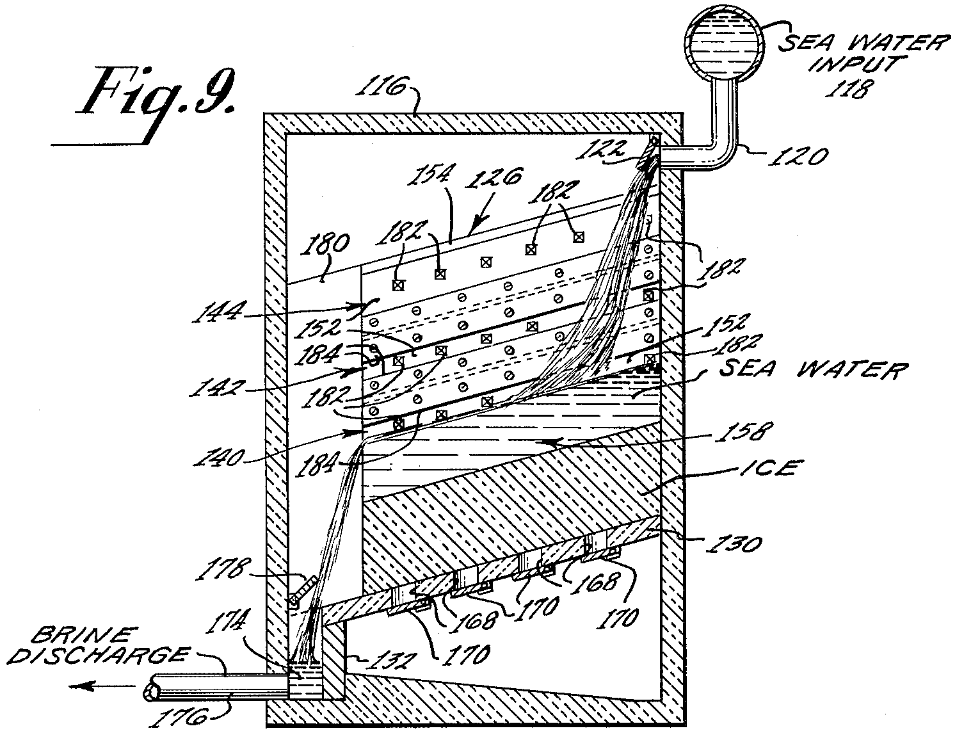
FIG. 9 is a sectional view taken along the line 9—9 of FIG. 7.

The thermoelectric freezing-melting unit, which is used in the system shown in FIG. 2, is structurally illustrated in FIGS. 7, 8 and 9. The unit is enclosed in a container 116 which may be made from insulating, refractory material such as the ceramic material which was used in constructing the container 26 of the evaporation-condensation unit. The sea water is fed into a manifold 118. The manifold 118 is connected by way of conduits 120 into the container 116. Valves 122, which are schematically illustrated as incorporating a flap-operated mechanism, control the flow of sea water from the conduits 120 into the container 116. A plurality of thermoelectric heat pump panel units 124, 126, 128 and 129 are disposed on an inclined plate 130. The plate 130 is supported on a stanchion plate 132 and at a side wall of the container 116. The inclined plate 130 may be composed of insulating refractory material and has a plurality of rows of apertures 168 therein. The portions of the plate 130 around the apertures 168 provide seats for flap valves 170.

Each of the heat pump panel units 124, 126, 128 and 129 is provided by a plurality of thermocouple elements 136, 138, 140, 142 and 144. These elements are each in the shape of a parallelepiped. A body of thermoelectrically active material 148, such as a semi-conductor, is sandwiched between a pair of conductive junction plates 150 and 152 to provide each of the thermoelectric elements 136, 138, 140, 142 and 144. The junction plates 150 and 152 are connected to adjacent junction plates to provide the panel array of thermocouple elements for each of the heat pump panel units 124, 126, 128 and 129. Connector plates 184 of insulating material similar to the connector plates 60 described above are fastened to each adjacent junction plate 150 and 152. A bar of insulating material 154 is attached at the top of each of the heat pump units 124, 126, 128 and 129.

The heat pump units 124, 126, 128 and 129 define a plurality of compartments in the container 116. Adjacent ones of these compartments are freezing compartments and melting compartments, respectively. During one phase of the cycle of operation of the freezing-melting unit, the compartments 156, 158, and 160 function as freezing compartments, while the adjacent compartments 162 and 164 function as melting compartments. The freezing-melting unit 18 is illustrated in the drawings when operating at an interval during one phase of the cycle of operation. However, during the next phase of the cyclical operation of the freezing-melting unit 18, the compartments reverse in function. The compartments 156, 158 and 160 then, operate as melting compartments, and the compartments 162 and 164 operate as freezing compartments.

The region between the bottom of the inclined plate 130 and the bottom of the container 116 provides a reservoir for fresh water. An outlet pipe 172 is connected to the reservoir to extract the fresh water therefrom. In front of the thermoelectric heat pump panel units 124, 126, 128 and 129 (to the left in FIG. 8 and FIG. 9), and between the side walls of the compartment 116, there is disposed a region or reservoir 174 for the collection of concentrated sea water or brine. This brine flows through the compartments formed by the heat pump units into the reservoir 174. The brine from this reservoir is discharged through a pipe 176. A valve 178, illustratively shown as a flap valve, closes the brine reservoir 174 during selected periods of operation of the device. As shown in FIGS. 8 and 9, a vertically disposed plate 180, which may be constructed of insulating material, is attached between the end of each of the heat pump panel units 124, 126, 128 and 129 and the left side wall of the container 116 and guides the flow of the sea water and brine from each compartment into the brine reservoir 174.

In operation, the freezing-melting unit which is contained in the container 116 is maintained at approximately the freezing point of water, namely zero degrees centigrade, by means of an auxiliary refrigeration unit, as shown in FIG. 2. The sea water is permitted to flow into alternate ones of the compartments 156, 158 and 160 by opening certain of the valves 122 at the terminus of the conduits 120. The valves 170 close the apertures 168 at the bottom of these compartments 156, 158 and 160. The valves leading into the brine discharge reservoir 174 from each of the compartments 156, 158 and 160 are maintained opened, as shown in FIG. 9. Sea water flows through each of the compartments 156, 158 and 160. The heat pump units 124, 126, 128 and 129 are operated, in a manner to be described in detail hereinafter in connection with FIG. 10, so that layers of fresh water ice form in each of the compartments 156, 158 and 160. Since ice forms from fresh water at a higher temperature than ice from sea water, the ice formed in each of the containers 156, 158 and 160 will be fresh water ice. The more concentrated sea water passes into the brine reservoir 174 and is discharged through the pipe 176. Formation of progressively higher layers of ice in each of the compartments 156, 158 and 160 is provided by energizing different ones of the thermocouple elements 136, 138, 140, 142 and 144 in the heat pumps 124, 126, 128 and 129 at different times. For example, the lowest one of the thermocouple elements is energized first and until a layer of ice forms in the adjacent region of the compartments 158, 156, and 160 and grows sufficiently to fill the region of the compartment with ice. Then, the next higher thermocouple element is energized so that the ice grows to also fill this region of the compartments 156, 158 and 160. By progressively raising the position of the interface at which ice formation occurs, it is possible to fill the compartments entirely with fresh water ice. In the past, freezing-melting methods of distillation have not proven successful, since a considerable amount of sea water occluded to the small ice crystals which are formed. By controlled freezing of sea water, in accordance with the invention, it is possible to provide pure ice. This ice is subsequently melted to provide fresh water.

When the compartments 156, 158 and 160 are completely full of ice, the cycle is reversed. The junction plates 152 and 150 of the heat pumps 124, 126, 128 and 129, which were arranged to be cold junctions for freezing purposes, are reversed in their operation to become hot junctions so as to melt the ice. The cyclic process may be continual.

A stage in the process is shown in FIGS. 7, 8 and 9. At this stage, the compartments 156, 158 and 160 are functioning as freezing compartments, while the compartments 162 and 164 operate as melting compartments. It may be observed that diamond shaped projections 182 extend from the junction plates 150 and 152 into the compartments to prevent the ice formed therein from slipping downwardly.

Sea water is permitted to flow through the valves 122 into the compartments 156, 158 and 160. The valves 122 which lead to the other compartments 162 and 164 are closed. Correspondingly, the valve 170 at the bottom of the compartments 162 and 164 are open for the passage of melting ice water therethrough, whereas the valves 170 at the bottom of the compartments 156, 158 and 160 are closed to prevent the water from flowing therethrough while ice is forming in these compartments. The brine discharge valves 178 are open in the ice forming compartments 156, 158 and 160 for the discharge of brine therefrom, whereas these valves are closed in the melting compartments to prevent any melting fresh water from escaping into the brine discharge reservoir 174. Ice progressively grows upwardly in the ice forming compartments 156, 158 and 160. The interface between the sea water and the ice rises gradually. In the melting compartments, ice has been formed and is melting from the bottom interface. This melting ice passes as ice water, through the apertures 168 on the bottom of the respective compartments, into the fresh water output reservoir and thence out of the fresh water output pipe 172. As was mentioned heretofore, only one thermocouple element at a time is energized in each of the heat pump panels 124, 126, 128 and 129. This element is the element adjacent to the interface. Freezing the ice water at one level as the water flows over the interface permits the formation of pure ice without excessive occlusion of salt therein. The small temperature gradient between the adjacent compartments and across each heat pump unit 124, 126, 128 and 129 provides for greater efficiency of operation. Moreover, heat absorbed from the freezing water is efficiently pumped for use in melting the fresh water ice in the adjacent compartment.

Figure 10:
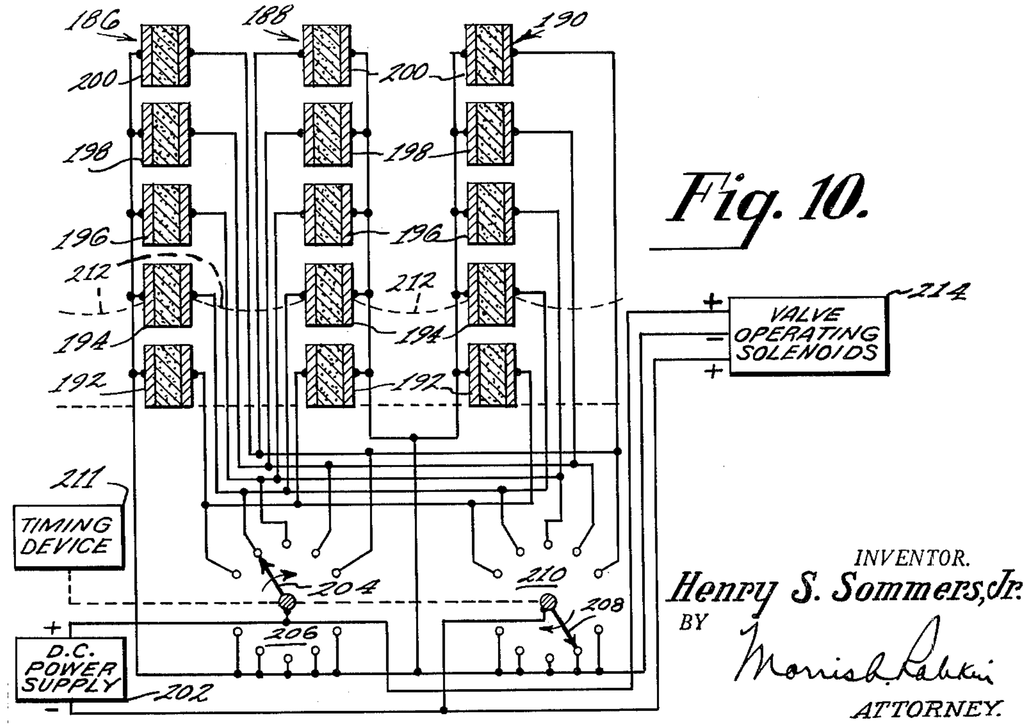
FIG. 10 is a simplified, schematic diagram showing the electrical connection of the thermoelectric freezing-melting unit illustrated in FIGS. 7, 8 and 9.

Referring now to FIG. 10, circuitry for cyclically changing the operation of the freezing-melting unit 18 is shown. Only three heat pumps are shown for purposes of simplified illustration. They are designated by the reference numerals 186, 188 and 190. Each of the heat pumps is provided by a plurality of thermocouple elements 192, 194, 196 and 198 and 200. The junction plates of each of the thermocouple elements are connected to the terminals of a pair of rotary switches 206 and 210. These switches are simultaneously actuated as bya timing device 211, such as includes a clock motor. A direct-current power supply 202 is connected to the rotating arms 204 and 208 of the switches 206 and 210. The positive terminal of the direct-current power supply is connected to the arm 204 of one switch 206. The negative terminal of the direct-current power supply 202 may be connected to the rotating arm 208 of the other switch 210. In the position of the switches illustrated, the thermocouple element 194 of each of the heat pump units 186, 188 and 190 is energized. It is assumed that the ice-water interface, illustrated by the dash line 212, is disposed adjacent to the junction plates of the energized thermocouple element 194. As the switch progresses, successively higher ones of the thermocouple elements 196, 198 and 200 are activated. After the thermocouple element 200 is activated, the lowest one of the thermoelectric elements 192 is again reactivated. However, this thermocouple element 192 is actuated in the opposite sense, so that its junctions are reversed. The operation of the unit may be cyclical and continual. It will be observed that the change from the melting cycle to the freezing cycle results from the reversal of the direction of current flow. Connected to the switches 206 and 210 and the power supply 202 may be a number of solenoids 214 for operating the valves in the sequence above set forth.

There has therefore been described a unique system for purifying sea water to provide fresh water therefrom. The system is, as may be observed, much less complicated than systems for this purpose which were heretofore available. The principle of operation involved may be used in other systems for effecting a change of phase by use of thermoelectric heat pump apparatus. For example, by a rearrangement of the switching and valve sequence, a series of molten and solid zones can be made to pass upwardly through each cell, thus making the unit into a regenerative zone purifier. This will permit the adaptation of the high thermal efficiency of the thermoelectric heat pump to the zone purification of materials.

Figure 12:
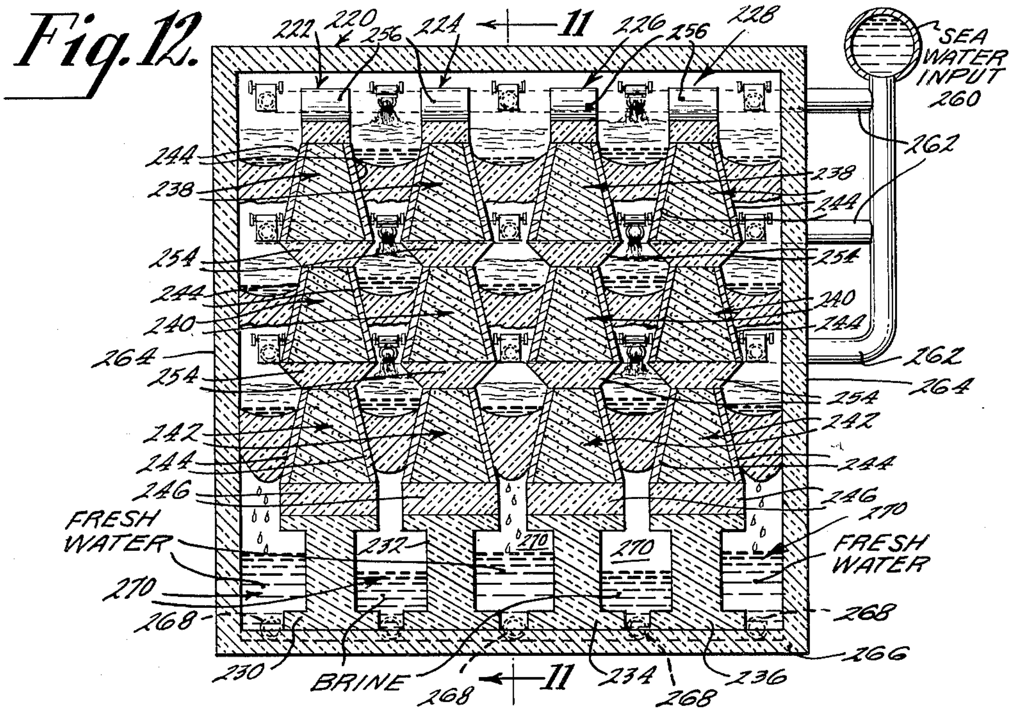
FIG. 12 is a sectional view taken along the line 12—12 of FIG. 11 as viewed in the direction of the arrows.
Figure 11:
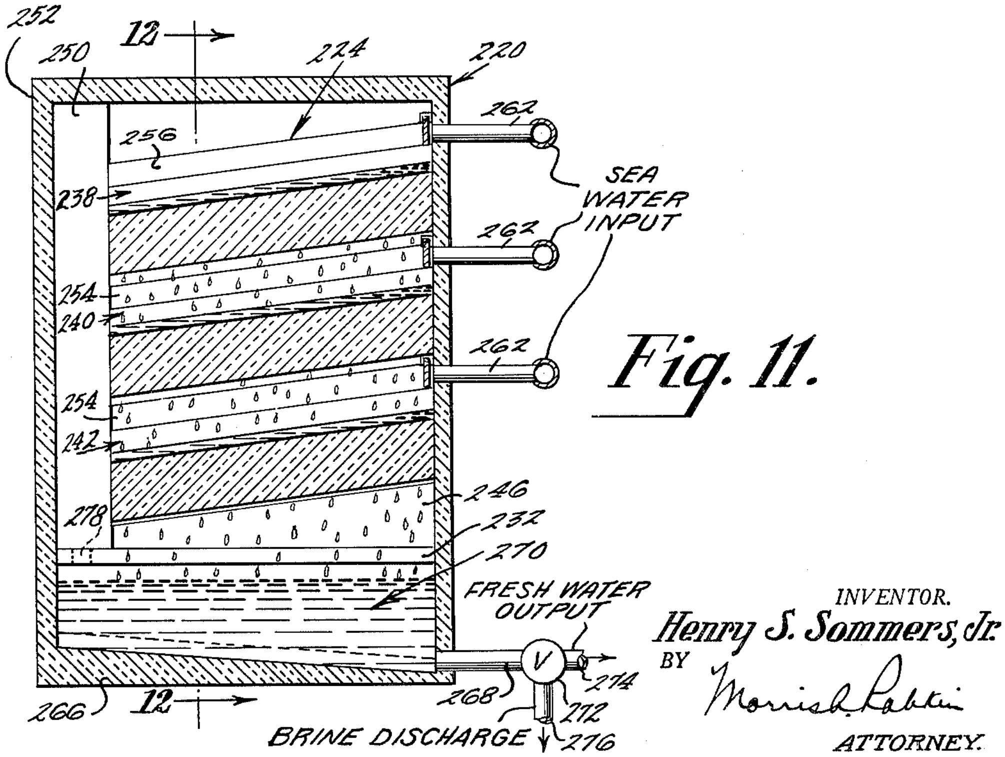
FIG. 11 is a sectional view of another embodiment of a thermoelectric freezing-melting unit constructed in accordance with the present invention, the section being taken along line 11—11 of FIG. 12.

Another embodiment of a freezing-melting unit provided by the present invention is illustrated in FIGS. 11 and 12. A container 220 of insulating material, similar to the material used in constructing the containers 26 and 116 described in connection with FIGS. 4 and 7, includes a number of heat pump units 222, 224, 226 and 228 which are arranged vertically and supported on "I" beams 230, 232, 234 and 236, respectively. These beams may be constructed from the same material as the container 220. Each of the heat pumps consists of a plurality of thermocouple elements 238, 240, 242, only three of which are shown for purposes of simplifying the illustration. Each element is in the form of a tapered bar of some thermoelectrically active material. Metal plates 244 are in conductive contact with the side surfaces of the bars of thermoelectrically active material. Tapered cells are formed between the thermoelectric elements of adjacent heat pump units. The narrow extremity of these cells is disposed at the bottom thereof. The bottom-most thermoelectric element rests on a bar 246 of insulating material the respective bars 246 resting upon the "I" beams 230, 232, 234 and 236. A vertical bar 250 of insulating material is disposed between the front of each of the thermoelectric heat pump units and a front side wall 252 of the container 220. Bars 254 of insulating material, which are tapered, separate each of the thermoelectric elements 238, 240, 242. Other bars 256 of insulating material are disposed on the tops of the upper thermocouple elements 238.

A sea water input manifold 260 is connected through a series of pipes 262 into the container 220. A different pump leads into each of the cells formed between the adjacent thermocouple elements and between the end thermocouple elements and the end walls 264 of the container 220. Flap valves similar to the valves 122 used in FIG. 7 control the flow of sea water from the pipes 262 into each of the cells.

The floor 266 of the container 220 is sloped gently and conduits 268 leading from the container 220 are disposed at the lower-most level of the floor 266. A conduit 268 is connected at the bottom of the container in each of a plurality of fluid collection chambers 270 formed by the surfaces of the "I" beams 230, 232, 234 and 236. A two-way or distribution valve 272 is connected to each of the conduits 268 for channeling the fluid collected in the chambers 270 to either one of a fresh water output conduit 274 or a brine discharge conduit 276.

In operation, the heat pumps 222, 224, 226 and 228 are activated, as by being connected in parallel to a common source of direct current. The current through each of the thermocouple elements 238, 240 and 242 is polarized so that adjacent ones of the metal plates 244 which form the junctions of the thermocouple elements 238, 240 and 242 provide either hot (heat discharging) junctions or cold (heat absorbing) junctions. Freezing and melting of fresh water ice occurs simultaneously in each of the cells. The valves admit salt water in the cells between alternate ones of the heat pumps 222, 224, 226 and 228. Thus, the cells between pairs of adjacent heat pumps 222, 224 and heat pumps 226, 228 are cells in which freezing takes place. The valves leading into these cells are open, as indicated in the drawing, and sea water enters therein. Because of the tapered construction of the cells, freezing will start in the constricted bottom thereof and the ice-salt water interface will rise in each of the cells until all of the cells are filled with pure ice.

The thermocouple elements 238, 240, 242 are tilted from the sea water input side of the compartment to the front side 252 thereof. Thus, the salt water will flow down the compartment, through the duct formed by adjacent ones of the vertical bars 250, and through the openings 278 near the front end of each of the "I" beams 230, 232, 234 and 236. This overflow sea water, which is not frozen, will be more concentrated since some fresh water is extracted therefrom to form ice in the cells and the overflow sea water may be considered to be brine. This brine will collect in certain other chambers 270 formed between the "I" beams 230 and 232 and between the "I" beams 234 and 236 and will be withdrawn through the conduits 268. The distributing valve 272 is adjusted so that this brine flows through the brine discharge conduit 276. At the same time, ice which has already been formed in the cells between other heat pump units 224 and 226 will be melted by the hot junction plates 244 of the thermocouple elements 238, 240 and 242. The valve leading into these cells between the heat pump units 224 and 226 are closed so that salt water cannot enter them. The fresh water ice in the melting cells melts at both the top and bottom and flows downwardly along the inclined surfaces of the ice into one of the chambers 270 between the "I" beam members 232 and 234. Also, the water from the melted ice in the upper ones of the cells falls into the cells immediately beneath and assists in melting the ice contained in the lower cells. The ice melts first at the heated walls of the thermocouple elements, and the tapered blocks of ice will gradually settle. Because of the settling of the ice in the cells, a final segment of ice will be left in the constricted bottoms of each of the cells at the end of a melting cycle. These segments of ice will serve as seeds to facilitate the growth of fresh water ice in the freezing part of the cycle, thus assuring the proper growth of pure ice, free from salt occlusions.

The process is cyclical so that freezing and melting occurs successively in the same cells. Some advantages of the embodiment of the invention illustrated in FIGS. 11 and 12 are that all of the thermocouple elements 238, 240 and 242 in all of the heat pump units 222, 224, 226 and 228 operate simultaneously. In other words, the duty cycle of the equipment is 100 percent. The thermal efficiency of the apparatus is also increased since melting occurs directly at the walls of the thermocouple elements, that is, at the metal junction plates 244. The melting occurs first at the heated metal plates 244 and the ice settles as it melts at the surface thereof. Because of the constricted ends of the cells, the maintenance of a seed of pure water ice is possible to facilitate the growth of pure ice during the freezing cycle.

What is claimed is:

1. Distilling apparatus comprising means defining still and condensor chambers and including a Peltier heat pump operatively associated with said chambers, said heat pump comprising thermoelements and hot and cold thermojunction members, said hot thermojunction members being disposed to supply heat to a raw feed fluid in said still chamber for vaporization of said fluid, and said cold thermojunction members being disposed to absorb heat from a vapor in said condensing chamber for condensation of said vapor, the heat absorbed by said cold thermojunction members being delivered by said heat pump to said hot thermojunction members for transfer to said raw feed fluid.

2. Distillation apparatus comprising a container, a wall disposed within said container and defining evaporation and condensation chambers therein, said wall comprising a Peltier heat pump having hot surface portions disposed in heat transfer relationship with a medium in said evaporation chamber and having cold surface portions disposed in heat transfer relation with a medium in said condensation chamber, the heat absorbed from said medium in said condensation chamber by said cold surface portions being pumped by said heat pump to said hot surface portions for transfer to the medium in said evaporation chamber.

3. Thermoelectric apparatus comprising a first heat exchange section having a first wall, a second heat exchange section having a second wall, a thermocouple element including body of thermoelectrically active material and a pair of junction members on opposite sides of said body, said first wall including one of said pair of junction members, said second wall including the other of said pair of junction members, means for effecting with said thermocouple elements a change of physical phase of a medium in said first section from a first phase to a second phase and a change of phase of said medium when in said second section from said second phase to said first phase, and means for circulating the medium while in said second phase between said first and said second sections.

4. Distillation apparatus comprising an evaporator, a condenser located adjacent said evaporator and adapted to receive a vapor therefrom, and a thermocouple panel positioned with its hot junctions in heat exchange relationship with said evaporator and its cold junctions in heat exchange relationship with said condenser to pump heat from said condenser into said evaporator.

5. Distillation apparatus comprising an evaporator, a condenser located adjacent said evaporator and adapted to receive vapor therefrom, a thermoelectric heat pump panel positioned with its hot junctions in heat exchange relationship with said evaporator and its cold junctions in heat exchange relationship with said condenser to pump heat from said condenser into said evaporator, and supplemental heat exchange means for raising the temperature of a liquid in said evaporator substantially to its vaporization temperature.

6. Thermoelectric apparatus for treating material comprising (a) a container, (b) means in said container for providing heating and cooling compartments, individually for effecting a change of physical phase of the material from one phase to another phase, or vice versa, (c) said last-named means including a thermoelectric heat pump having a hot junction and a cold junction each on an opposite side of said pump, said hot junction and said cold junction respectively defining said heating and cooling compartments.

(d) said heat pump being operable for changing the phase of said material from said one phase to said other phase and for providing, in both said compartments, a quantity of said material in said other phase, (e) said cold junctions being disposed in heat exchange relationship with said material when in said one phase in said cooling compartment to absorb heat from said material therein for effecting the change of phase of said material from said one phase to said other phase, and (f) said hot junctions being disposed in heat exchange relationship with said material when in said other phase in said heating compartment to supply heat thereto for effecting the change of state of said material from said other phase to said one phase.

7. Thermoelectric apparatus for treating material comprising (a) a container, (b) means in said container for providing compartments in which to change the physical phase of said material and including a thermoelectric heat pump having a hot junction and a cold junction each on an opposite side of said pump, said hot junction and said cold junction cooperating with said container to define said change of phase compartments, one for heating and the other for cooling the material, (c) means for introducing said material into said compartments, (d) said heat pump being operable for changing the phase of said material from one said phase to another said phase and at least initially providing a quantity of said material in said other phase in both said heating and said cooling compartments, and (e) said heat pump maintaining the temperature of said material in said compartments near that at which changes in phase of said material from said one phase to said other phase and from said other phase to said one phase take place simultaneously and respectively in different ones of said compartments.

8. In a system for purifying liquids, the combination comprising (a) a container, (b) a plurality of liquid vaporization compartments and vapor condensation compartments in said container, (c) a plurality of thermoelectric heat pump units disposed one adjacent another in said container, (d) said heat pump units each providing heated and cooled surfaces on its opposite sides, the cooled and heated surfaces of different adjacent ones of said units respectively facing each other to define said condensation compartments and vaporization compartments respectively between said facing cooled surfaces and said facing heated surfaces, (e) means for admitting liquid to be purified into said vaporization compartments, (f) means for withdrawing purified liquid from said condensation compartments, and (g) adjacent pairs of said vaporization and condensation compartments being in vapor communicating relationship with each other whereby the vapor formed in said vaporization compartments is condensed in said condensation compartments.

9. In a system for purifying a liquid, the combination comprising (a) a container, (b) a plurality of thermoelectric heat pump units, each having heated and cooled surfaces on its opposite sides, (c) means including said heat pump units for providing a plurality of compartments, some for changing the physical phase of said liquid from the liquid phase to another phase and others for restoring the phase of said liquid from said other phase to said liquid phase, said compartments providing means including means for mounting said heat pump units one adjacent another in said container with the cooled and the heated surfaces of different adjacent ones of said units respectively facing each other to define said plurality of compartments, each between a different pair of said cooled surfaces and a different pair of said heated surfaces, (d) each of said heat pump units comprising a plurality of thermocouple elements joined together to form a panel structure, (e) each of said thermocouple elements being provided by a body of thermoelectrically active material and a pair of conductive members on said opposite sides, (f) said conductive members providing said cooled and said heated surfaces of said heat pump units, (g) means for admitting impure liquid and withdrawing pure liquid from different ones of said compartments, (h) means for providing, at least in those of said compartments from which said liquid is withdrawn, a quantity of said liquid in said other phase, and (i) direct current power supply means for energizing all of said heat pump units.

10. In a system for purifying sea water to provide fresh water therefrom, the combination comprising (a) vaporization and condensation compartments, (b) a plurality of thermoelectric heat pump units, each having heated and cooled surfaces respectively on its opposite sides, (c) said heat pump units being mounted one adjacent another with the cooled and the heated surfaces of different adjacent ones of said units respectively facing each other and respectively defining said condensation compartments and said vaporization compartments, each between a different pair of said cooled surfaces and a different pair of said heated surfaces, (d) means for admitting said sea water into one end of each of said vaporization compartments, (e) means providing a path for vaporized sea water between adjacent vaporization and condensation compartments, (f) each of said heat pump units comprising a plurality of thermocouple elements, (g) each of said elements including a body of thermoelectrically active material sandwiched between plates of conductive material forming said cooled and said heated surfaces on opposite sides of said body, different ones of said bodies having different thicknesses as measured between said conductive plates, and (h) means for arranging said elements in rows in accordance with the thickness of said body of material thereon from said one end of each of said compartments to said opposite end thereof to provide said units, said elements having thicker bodies of thermoelectrically active material disposed at said one end and said elements having thinner bodies of thermoelectric elements disposed at the opposite end thereof.

11. In a system for purifying a liquid, the combination comprising (a) a container, (b) a plurality of liquid vaporization and vapor condensation compartments in said container, (c) a plurality of thermoelectric heat pump units, each providing heated and cooled surfaces on its opposite sides, (d) means for mounting said heat pump units one adjacent another in said container with the cooled and the heated surfaces of different adjacent ones of said units respectively facing each other and respectively defining said condensation and vaporization compartments, each between a different pair of said cooled surfaces and a different pair of said heated surfaces, (e) adjacent ones of said vaporization and condensation compartments being in vapor communication with each other, (f) said heat pump units each comprising (1) a plurality of thermocouple elements joined together to form a panel structure, (2) said thermocouple elements each including a body of thermoelectrically active material having a pair of conductive members on said opposite sides of their respective heat pump units, and (3) said conductive members providing said cooled and said heated surfaces of said heat pump units, (g) means for admitting said liquid to be purified into said vaporization compartments, (h) means for withdrawing purified liquid from said condensation compartments, (i) direct current power supply means for energizing all of said heat pump units, (j) means for discharging impure liquid from said vaporization compartments, and (k) said last-named means being located on an opposite side of said container from said means for admitting said liquid to be purified into said vaporization compartments whereby a circulation of said liquid in said vaporization compartments from said one side of said container to said opposite side thereof results.

12. In a system for purifying a liquid, the combination comprising (a) a container, (b) a plurality of liquid vaporization and vapor condensation compartments, (c) a plurality of thermoelectric heat pump units having opposite sides and also having separate heated and cooled surfaces on its opposite sides, (d) means for mounting said heat pump units one adjacent another in said container with the cooled and the heated surfaces of different adjacent ones of said units respectively facing each other and respectively defining condensation and vaporization compartments, each between a different pair of said cooled surfaces and a different pair of said heated surfaces, (e) adjacent vaporization and condensation compartments being in vapor communication with each other, (f) means for admitting said liquid to be purified into said vaporization compartments, (g) means for withdrawing liquid from said condensation compartments, (h) direct current power supply means for energizing all of said heat pump units, (i) means located on an opposite side of said container from said means for admitting said liquid to be purified into said vaporization compartments for discharging liquid from said vaporization compartments, whereby a circulation of said liquid in said vaporization compartments from said one side of said container to said opposite side thereof results, and (j) each of said heat pump units comprising (1) a plurality of thermocouple elements joined together to form a panel structure, (2) each of said thermocouple elements being provided by a body of thermoelectrically active material and a pair of conductive members, each on a different one of said opposite sides of their respective heat pump units.

(3) said conductive members providing said cooled and said heated surfaces of said heat pump units, (4) said bodies of thermoelectrically active material in said thermoelectric elements being of different thickness, the one of said elements having the thickest body of thermoelectrically active material being disposed closest to the side of said container at which said liquid to be purified is admitted, and (5) said other elements being disposed in accordance with the thickness of the bodies of thermoelectrically active material included therein between said last-named side of said container and said side of said container at which said fluid is discharged from said vaporization compartments.

13. Thermoelectric apparatus for treating material comprising (*a*) a container having a pair of regions in which a change of physical phase from a first phase to a second phase and from said second phase to said first phase, respectively, takes place, (b) a plurality of thermoelectric heat pumps, each having a hot junction side and a cold junction side, (c) said heat pumps being disposed one adjacent another in spaced relationship with each other in said container, (d) the hot junction side ana the cold junction side of at least one of said plurality of heat pumps respectively facing the hot junction side and the cold junction side of different ones of said plurality of heat pumps which are disposed adjacent to said one heat pump, said facing cold junction sides and said facing hot junction sides respectively defining one and the other of said pair of regions, said regions being adapted to receive a material to be treated, (e) said heat pump being operable for changing said material from said first phase to said second phase and for providing, in both of said pair of regions, a quantity of said material in said second phase, and (f) said heat pumps providing different temperatures in different ones of said pair of regions for supporting said changes of phase of further quantities of said material from said first phase to said second phase in one of said pair of regions and from said second phase to said first phase in the other of said pair of regions.

14. Apparatus for purifying material by changing said material from its liquid phase to another phase and then restoring said material from said other phase to its liquid phase, said apparatus comprising (a) means defining a first chamber for changing said material from said liquid phase to said other phase, (b) means defining a second chamber for changing said material from said other phase to said liquid phase, (c) said defining means including a thermoelectric heat pump operatively associated with said chambers, said heat pump having a hot junction and a cold junction, (d) said heat pump being operable for changing said material from said liquid phase to said other phase and for providing, in both said chambers, a quantity of said material in said other phase, and (e) said hot junction being disposed to supply heat to said material in one of said chambers for changing the phase of said material in said one chamber, and said cold junction being disposed to absorb heat from said material in said other chamber for changing the phase of said material in said other chamber, the heat absorbed by said cold junction being delivered by said heat pump to said material in said one chamber for effecting the change of phase of said material in said one chamber.

15. Apparatus for purifying material by changing said material from its liquid phase to another phase and from said other phase to its liquid phase, said apparatus comprising (a) means defining a first chamber for changing said material from said liquid phase to said other phase, (b) means defining a second chamber for changing said material from said other phase to said liquid phase, (c) said defining means including a thermoelectric heat pump operatively associated with said chambers, said heat pump having a hot junction and a cold junction, and (d) said hot junction being disposed to supply heat to said material in one of said chambers for changing the phase of said material in said one chamber, and said cold junction being disposed to absorb heat from said material in said other chamber for changing the phase of said material in said other chamber, the heat absorbed by said cold junction being delivered by said heat pump to said material in said one chamber for effecting the change of phase of said material in said one chamber.

16. Liquid purification apparatus comprising means defining first and second chambers and including a Peltier heat pump operatively associated with said chambers, said pump comprising a thermoelement and hot and cold thermojunction members, said pump being operable for changing the physical phase of a liquid from the liquid phase to a second phase and for providing, in at least said second chamber, a quantity of said liquid in said second phase, one of said hot and cold thermojunction members being disposed to transfer heat with respect to said liquid in said first chamber for changing the phase of said liquid from the liquid phase to said second phase, and the other of said hot and cold thermojunction members being disposed to transfer heat with respect to said liquid while said liquid is in said second phase in said second chamber for restoring said liquid to said liquid phase, the heat absorbed from said liquid while in one of said liquid phase and said second phase by said cold thermojunction members being transferred to said liquid while in the other of said liquid phase and said second phase by said hot thermojunction members.

References Cited by the Examiner

UNITED STATES PATENTS

| | | | |
|---|---|---|---|
| 1,804,072 | 5/31 | Turrettini | 62—1 X |
| 1,966,938 | 7/34 | Stone | 202—75 |
| 2,749,716 | 6/56 | Lindenblad | 62—1 X |
| 2,760,919 | 8/56 | Latham | 202—75 |
| 2,779,172 | 1/57 | Lindenblad | 62—1 X |
| 2,800,772 | 7/57 | Carroll | 62—3 |
| 2,870,610 | 1/59 | Lindenblad | 62—3 |
| 2,886,618 | 5/59 | Goldsmid | 62—3 X |

NORMAN YUDKOFF, *Primary Examiner.*

GEORGE D. MITCHELL, ALPHONSO D. SULLIVAN, RICHARD D. NEVIUS, *Examiners.*